United States Patent
Nakamura

(10) Patent No.: US 7,816,150 B2
(45) Date of Patent: Oct. 19, 2010

(54) FABRICATION PROCESS OF SEMICONDUCTOR DEVICE

(75) Inventor: Ko Nakamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/933,684

(22) Filed: Nov. 1, 2007

(65) Prior Publication Data

US 2008/0113453 A1    May 15, 2008

(30) Foreign Application Priority Data

Nov. 13, 2006    (JP)    ............... 2006-307049

(51) Int. Cl.
*H01L 21/8242*    (2006.01)

(52) U.S. Cl. ............... 438/3; 257/295; 257/E27.104; 257/E29.164; 257/E29.272; 257/E21.108; 257/E21.436; 257/E21.664

(58) Field of Classification Search ............... 438/3, 438/FOR. 189; 257/295, E27.104, E29.164, 257/E29.272, E21.108, E21.436, E21.664
See application file for complete search history.

(56) References Cited

U.S. PATENT DOCUMENTS

| | | | |
|---|---|---|---|
| 6,338,970 B1 * | 1/2002 | Suh | ............... 438/3 |
| 7,205,594 B2 * | 4/2007 | Saigoh | ............... 257/295 |
| 2002/0074601 A1 * | 6/2002 | Fox et al. | ............... 257/350 |
| 2002/0109168 A1 * | 8/2002 | Kim et al. | ............... 257/295 |
| 2004/0173874 A1 * | 9/2004 | Saigoh | ............... 257/535 |
| 2005/0161717 A1 * | 7/2005 | Nakamura et al. | ............... 257/295 |
| 2006/0214210 A1 * | 9/2006 | Itokawa et al. | ............... 257/296 |
| 2008/0160645 A1 * | 7/2008 | Nakamura et al. | ............... 438/3 |

FOREIGN PATENT DOCUMENTS

| | | |
|---|---|---|
| JP | 831951 A | 2/1996 |
| JP | 878636 A | 3/1996 |
| JP | 10321809 A | 12/1998 |
| JP | 200040799 A | 2/2000 |
| JP | 2001237384 A | 8/2001 |

* cited by examiner

*Primary Examiner*—George Fourson
(74) *Attorney, Agent, or Firm*—Fujitsu Patent Center

(57) ABSTRACT

A method for fabricating a semiconductor device includes the steps of forming a first ferroelectric film over a lower electrode, crystallizing the first ferroelectric film, forming a second ferroelectric film in an amorphous state over the first ferroelectric film so as to fill voids existing on a surface of the first ferroelectric film, and forming an upper electrode over the second ferroelectric film of the amorphous state, wherein the crystallizing step of the first ferroelectric film is conducted by a thermal annealing process at a temperature of 585° C. or higher.

16 Claims, 15 Drawing Sheets

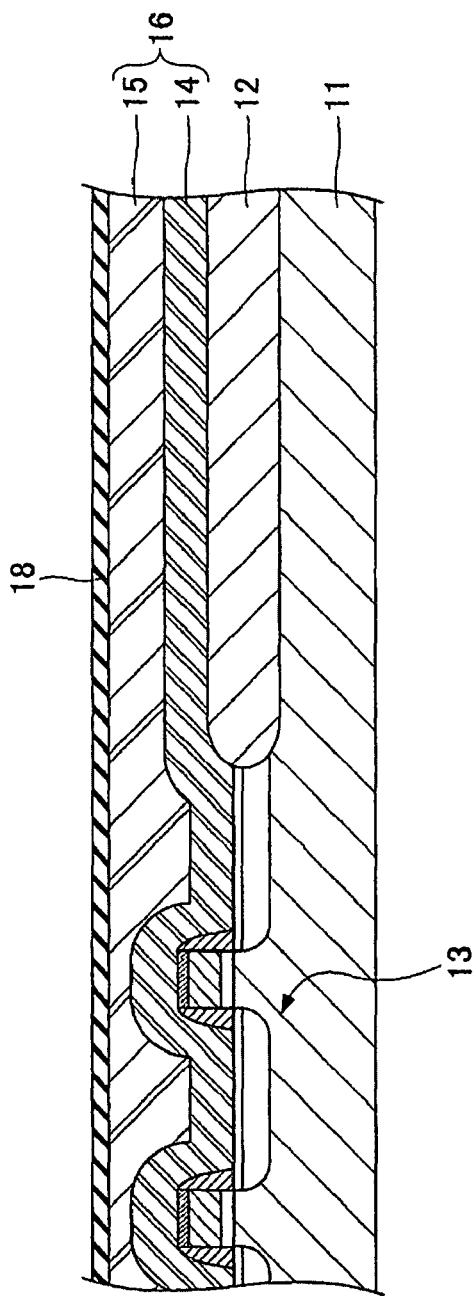
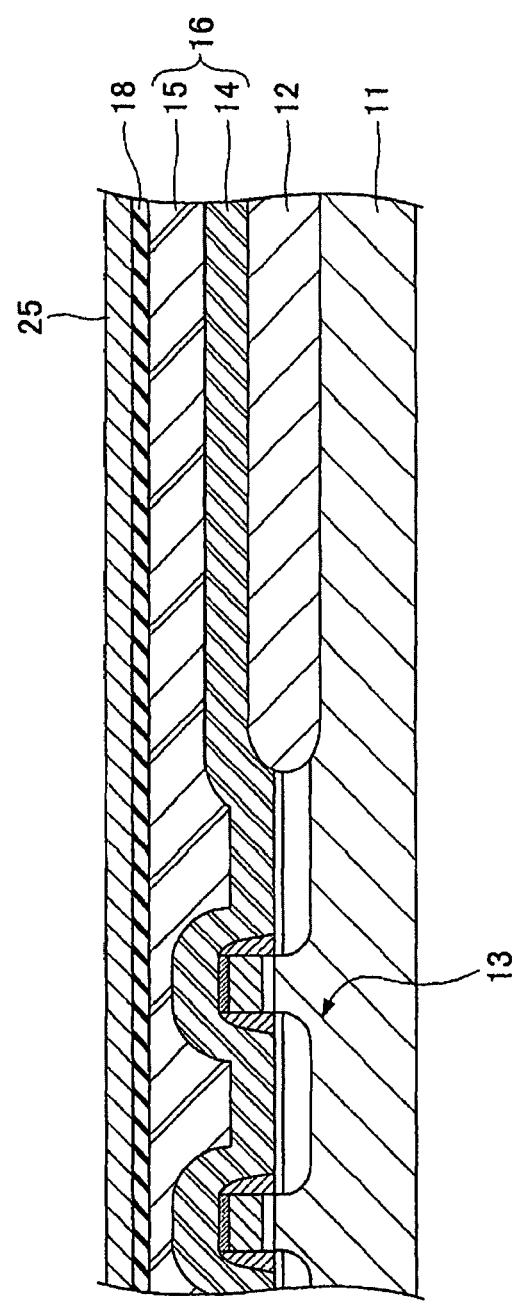
FIG.2C
FIG.2D

FABRICATION PROCESS OF SEMICONDUCTOR DEVICE

CROSS-REFERENCE TO RELATED APPLICATION

The present application is based on Japanese priority application No. 2006-307049 filed on Nov. 13, 2006, the entire contents of which are hereby incorporated by reference.

BACKGROUND OF THE INVENTION

The present invention generally relates to semiconductor devices and more particularly to a semiconductor device having a ferroelectric capacitor and fabrication process thereof. Especially, the present invention relates to a ferroelectric memory having improved TDDB resistance and imprint resistance and the fabrication process thereof.

With miniaturization of ferroelectric memory devices, reduction of capacitor area is in progress along with evolution of the ferroelectric circuit used therein from a 2T2C circuit construction to a 1T1C circuit construction. With a 2T2C circuit, two transistors and two capacitors are provided in a single memory cell, while with a 1T1C circuit, only one transistor and only one capacitor are provided in a single memory cell.

In view of the need of securing large switching electric charge for the ferroelectric film, a PZT film is used generally for the ferroelectric film with such reduction of capacitor area and use of the 1T1C circuit construction. Further, along with the reduction of capacitor area and evolution to the 1T1C circuit, there is also a need of suppressing the polarization inversion voltage for the ferroelectric capacitor that uses a PZT film. In relation to this, reduction of PZT film thickness is also in progress.

When the thickness of the PZT film is decreased, on the other hand, there is caused an increase of electric field as long as the same voltage as before is applied thereto, while such increase of electric field leads to increase of leakage current. Such leakage current of ferroelectric capacitor is attributed primarily to the voids existing at the grain boundaries in the ferroelectric film.

In the ordinary process of forming a ferroelectric capacitor having a PZT film, process steps of formation of lower electrode, formation of ferroelectric film, crystallization of the ferroelectric film, formation of upper electrode film, and thermal annealing of the ferroelectric film, are conducted consecutively with this order. With this process, crystals are formed in the ferroelectric film at the time of crystallization of the ferroelectric film, while formation of such crystals leads to formation of voids at the crystal grain boundaries. At the time of formation of the upper electrode film, such voids are filled with material constituting the upper electrode film, while such filling of the voids with the upper electrode film invites decrease of effective film thickness of the ferroelectric film and increase of the leakage current.

Thus, if such voids could be reduced, it becomes possible to decrease the leakage current significantly and it becomes possible to attain low leakage current sufficient for practical use even when the film thickness of the ferroelectric film is reduced.

Thus, Japanese Laid-Open Patent Application No. Hei 10-321809 discloses the following formation method of ferroelectric capacitor.

According to this process, the process of spin-coating, drying and crystallizing of a $SrBi_2Ta_2O_9$ (SBT) film is repeated three times at first. Next, after fourth spin-coating and drying process, a thermal annealing process is conducted at 600° C. for 5 minutes, and with this, the SBT film is obtained in the form of amorphous phase or microcrystalline phase. Next, formation of the upper electrode film is conducted, followed by a thermal annealing process in a reduced pressure ambient for 30 minutes. According to such a process, it is possible to obtain an SBT film having a smooth top surface.

Further, Japanese Laid-Open Patent Application No. Hei 8-78636 discloses following formation method of a ferroelectric capacitor.

With this method, spin-coating of a $(Ba, Sr)TiO_3$ (BST) film used for the high-K dielectric film and subsequent thermal annealing process thereof at a temperature lower than the crystallization temperature of BST are repeated plural times at first, and formation of upper electrode film is conducted thereafter. Further, thermal annealing process is conducted at a temperature higher than the crystallization temperature of BST.

Further, Japanese Laid-Open Patent Application No. Hei 8-31951 discloses a method of forming, after crystallization of a PZT film, a $SrTiO_3$ (STO) film or BST film thereon in the amorphous state, followed by formation of a Pt upper electrode. Further, Patent Reference 3 discloses the method of crystallizing the STO film or BST film in an oxygen gas ambient immediately after formation thereof.

Further, Japanese Laid-Open Patent Application No. 2001-237384 discloses a method for decreasing the leakage current. According to this prior art, a ferroelectric film of perovskite structure is formed on a lower electrode in a crystalline state, and a precursor liquid of a ferroelectric film is coated upon the foregoing ferroelectric film. After drying, the precursor film is subjected to a low-temperature annealing process conducted at a temperature lower than the perovskite crystallization temperature. After formation of the upper electrode, a high temperature annealing is conducted at a temperature higher than the perovskite crystallization temperature.

Japanese Laid-Open Patent Application No. 2000-40799 discloses a method for forming, in the case of using a Pt film for the upper electrode, forming a layer containing Pb, Pt and O between the ferroelectric film and the upper electrode for the purpose of suppressing hydrogen degradation of the ferroelectric film induced by catalytic action of Pt.

Further, United States Patent Application No. 2005/0161717 describes a method of forming, on a first ferroelectric film of crystalline state, a second ferroelectric film of amorphous state, forming an upper electrode on the second ferroelectric film, and applying, after forming the upper electrode, a thermal annealing process of the ferroelectric film.

Thus, with conventional technologies, it has been not possible to attain, for the ferroelectric capacitor, the goals of: maintaining high switching electric charge; low leakage current; improved insulation breakdown resistance; and improved imprint resistance, at the same time.

SUMMARY OF THE INVENTION

The present invention is directed to various embodiments of a method for fabricating a semiconductor device having the steps of: forming a first ferroelectric film over a lower electrode; crystallizing said first ferroelectric film; forming a second ferroelectric film in an amorphous state over said first ferroelectric film so as to fill voids existing on a surface of said first ferroelectric film; and forming an upper electrode over said second ferroelectric film of said amorphous state, wherein said crystallizing step of said first ferroelectric film is conducted by a thermal annealing process at a temperature of 585° C. or higher.

BRIEF DESCRIPTION OF THE DRAWINGS

FIGS. 2A-2G are diagrams showing the fabrication process of the ferroelectric memory according to the first embodiment of the present invention;

DETAILED DESCRIPTION OF THE INVENTION

Hereinafter, the present invention will be described in detail with reference to the attached drawings.

First Embodiment

Figure 1:
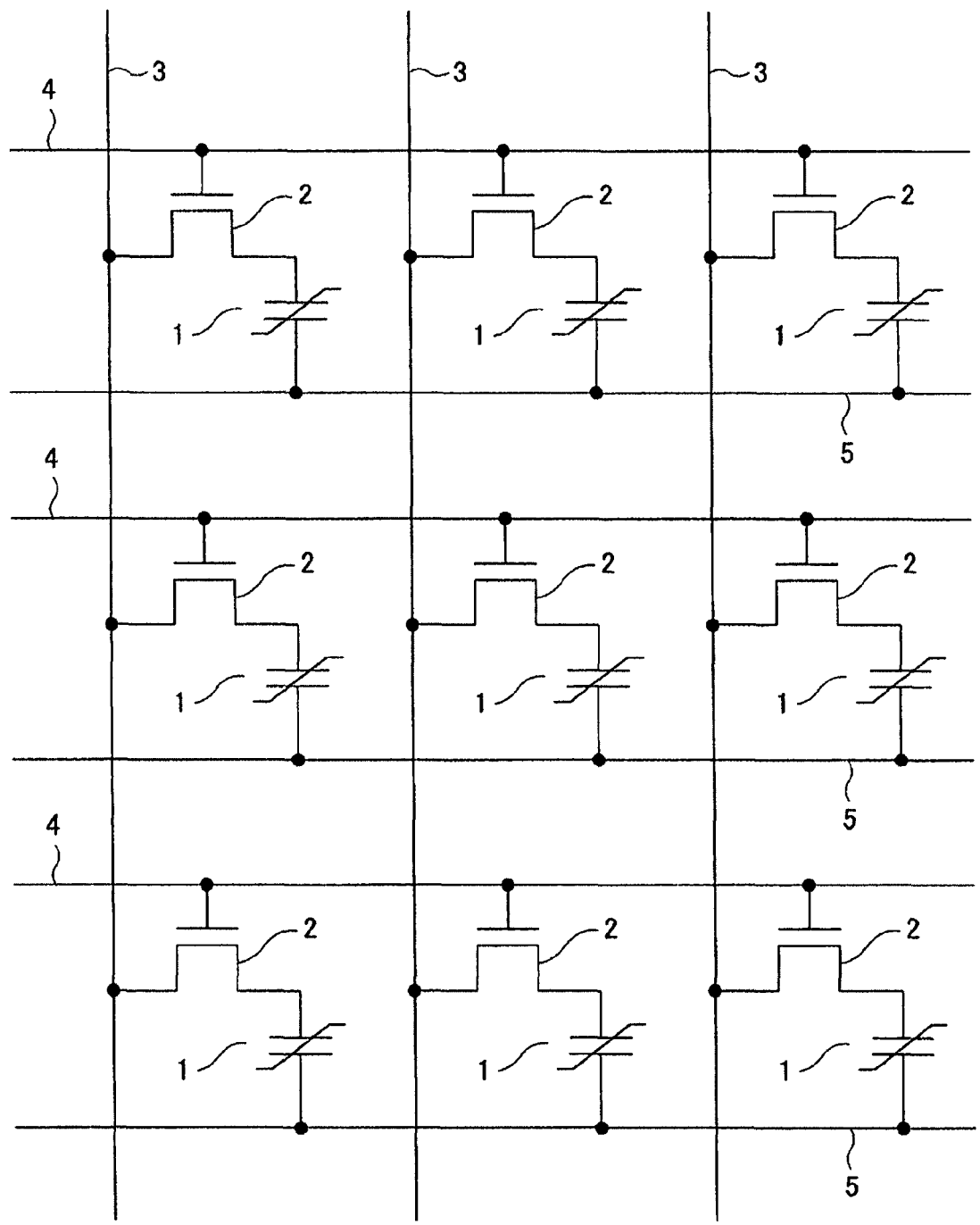
FIG. 1 is a circuit diagram showing the construction of a memory cell array of a ferroelectric memory (semiconductor device) fabricated according to a first embodiment of the present invention.

FIG. 1 is a circuit diagram showing the construction of a memory cell array of a ferroelectric memory (semiconductor device) fabricated according to a method of a first embodiment of the present invention.

Referring to FIG. 1, the memory cell array includes plural bit lines 3 each extending in a first direction and plural word lines 4 and plural plate lines 5 each extending in a second direction perpendicular to the first direction. Further, there are formed memory cells of the ferroelectric memory of the present embodiment in the form of array in conformity with a lattice pattern formed by the bit lines 3, word lines 4 and plate lines 5.

Each of the memory cell arrays includes a ferroelectric capacitor 1 and a MOS transistor 2.

More specifically, the MOS transistor 2 has a gate electrode connected to the word line 4, while one of the source/drain diffusion regions of the MOS transistor 2 is connected to the bit line 3 and the other of the source/drain diffusion regions is connected to one electrode of the ferroelectric capacitor. Further, the other electrode of the ferroelectric capacitor 1 is connected to the plate line 5.

It should be noted that each of the word lines 4 is shared by plural MOS transistors 2 aligned in the extending direction of the word line 4, and each of the plate lines 5 is shared by plural MOS transistors 2 aligned in the extending direction of the plate line 5. Similarly, each bit line 3 is shared by plural MOS transistors 2 aligned in the extending direction thereof. The extending direction of the word line 4 and the plate line 5 is designated as "row direction", while the extending direction of the bit line 3 is designated as "column direction".

In the memory cell array of the ferroelectric memory of such a construction, data is stored in the form of polarization state of the ferroelectric film in the ferroelectric capacitor 1.

Next, the fabrication process of the ferroelectric memory of the present embodiment will be explained with reference to FIGS. 2A-2G, wherein the cross-sectional structure of the memory cell will be explained together with the fabrication process thereof.

Figure 2A:
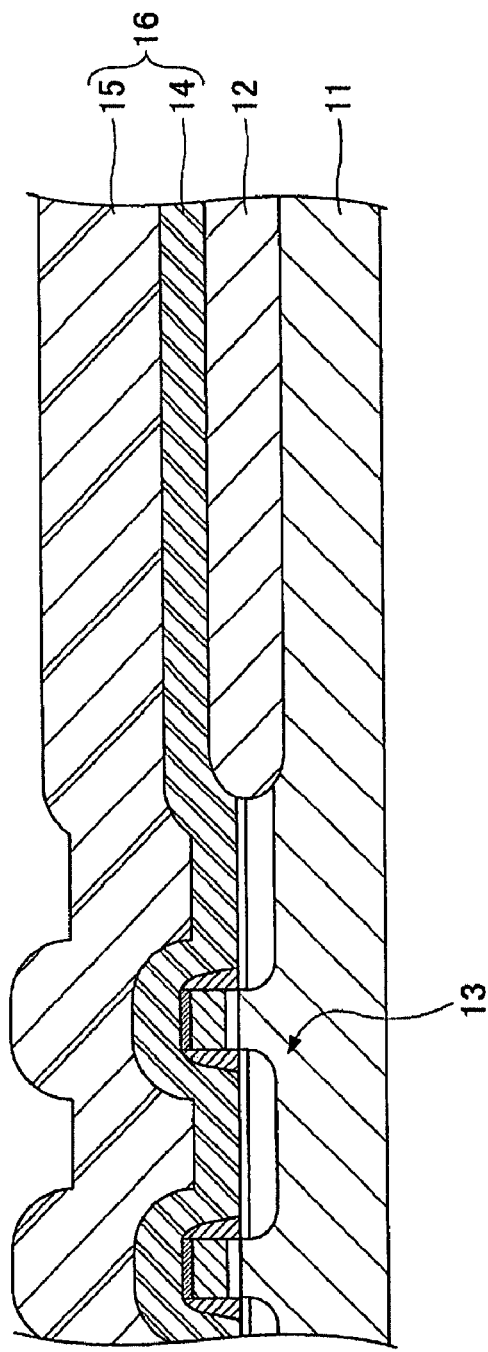

With the present embodiment, a device isolation insulation film 12 is formed on the surface of a silicon substrate 11 as shown in FIG. 2A, and wells (not shown) are formed subsequently by selectively introducing impurity elements into respective, predetermined active regions (transistor formation region). The silicon substrate 11 may have any of p or n conductivity types.

Next, a CMOS transistor 13 of LDD structure is formed in the active region, and an oxidation protection film 14 is formed by a CVD process so as to cover the CMOS transistor 13. For the oxidation protection film 14, an SiON film of the thickness of 200 nm may be used, for example.

Subsequently, an $SiO_2$ film 15 of the thickness of 600 nm is formed on the oxidation protection film 14 by a CVD process with the thickness of 600 nm, for example. Thereby, the oxidation protection film 14 and the $SiO_2$ film 15 form a first interlayer insulation film 16. For the formation of the $SiO_2$ film 15, TEOS (tetraethyl orthosilicate) may be used for the reaction gas, for example.

Figure 2B:
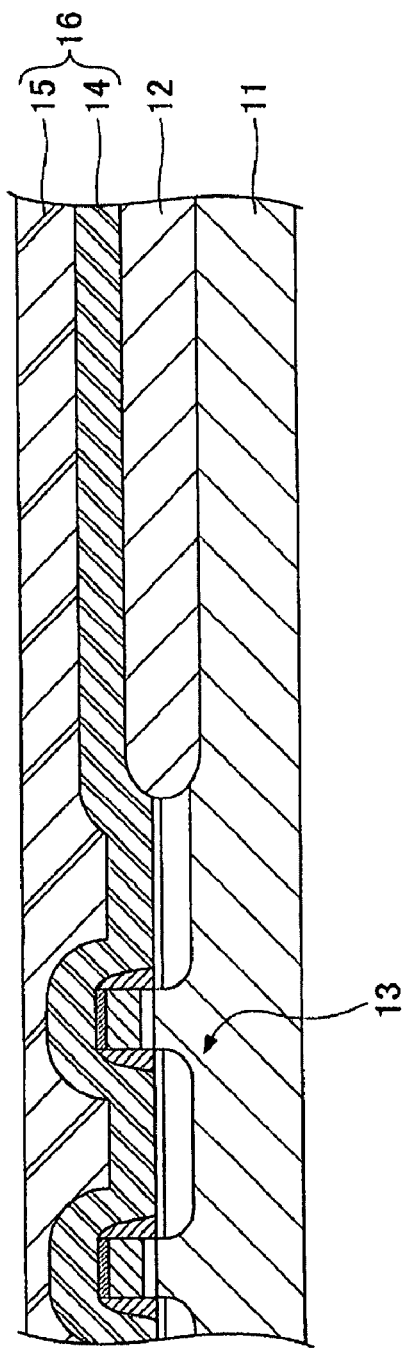

Next, as shown in FIG. 2B, the $SiO_2$ film 15 is subjected to planarization process conducted by chemical mechanical polishing (CMP) starting from a top surface thereof, wherein the interlayer insulation film 16 is polished to have a thickness of 785 nm as measured from the interface to the device isolation insulation film 12. Further, a thermal annealing process is conducted at 650° C. for 30 minutes in a $N_2$ gas ambient, and with this, degassing is achieved for the first interlayer insulation film 16.

Thereafter, as shown in FIG. 2C, an $Al_2O_3$ film 18 is formed on the $SiO_2$ film 15 by a high frequency sputtering process as an adhesion layer of lower electrode. The $Al_2O_3$ film 18 may have a thickness of 20 nm, for example.

Next, as shown in FIG. 2D, a Pt film 25 that becomes the lower electrode of the ferroelectric capacitor is formed on the $Al_2O_3$ film 18 by a sputtering process. The Pt film 25 may have a thickness of 150 nm.

Figure 2E:
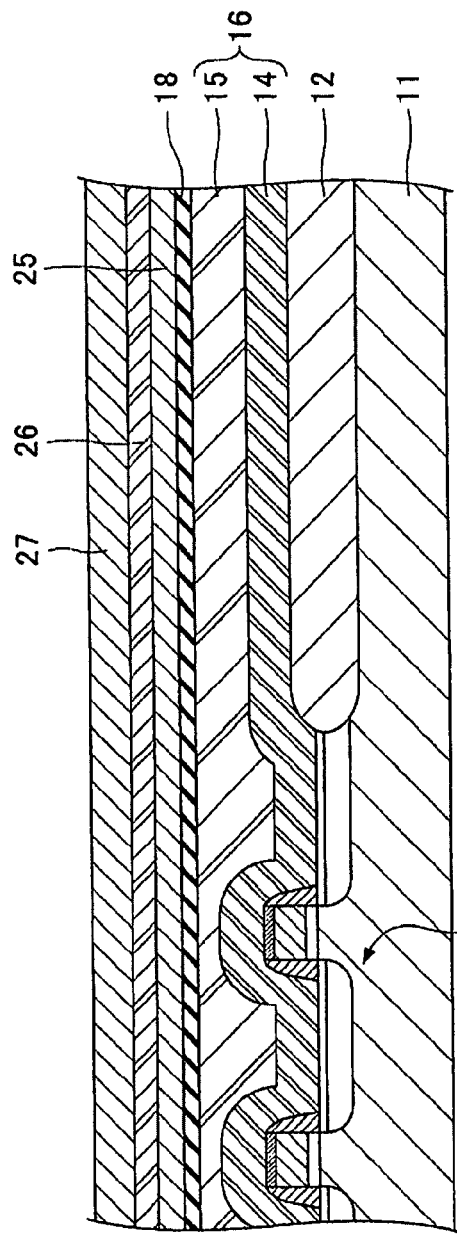

Next, as shown in FIG. 2E, a ferroelectric film 26 that functions as the capacitor insulation film of the ferroelectric capacitor is formed on the Pt film 25 by a high frequency sputtering process with a thickness of 120 nm, for example.

Here, the ferroelectric film 26 may be formed as a film having a two-layer structure. Hereinafter, formation of the ferroelectric film 26 will be described.

FIGS. 3A through 3E are cross-sectional view diagrams showing the process of forming the ferroelectric film 26 step by step.

Figure 3A:
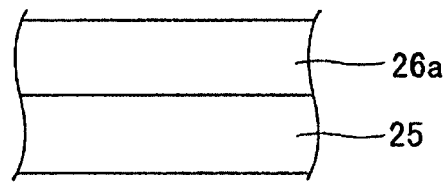
FIGS. 3A-3E are diagrams showing the method of forming a ferroelectric film.

First, as shown in FIG. 3A, a PZT film 26a of amorphous phase is formed on the lower electrode film 25 by a high frequency sputtering process with a thickness of 90 nm, for example.

Next, the PZT film 26a is subjected to crystallization by conducting a thermal annealing process at a temperature higher than 585° C.

Figure 3B:
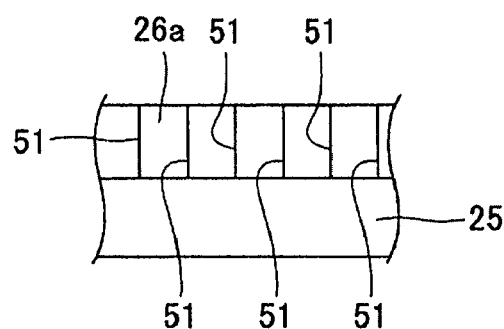

For example, the thermal annealing process is conducted in an oxygen gas ambient with an oxygen concentration of 1.25% for 90 seconds at 600° C. As a result of this thermal annealing process, there are formed grain boundaries 51 in the PZT film 26a as shown in FIG. 3B.

Figure 3C:
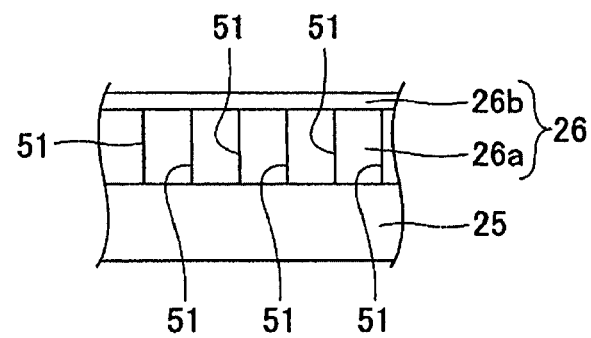

Next, as shown in FIG. 3C, a PZT film 26b of amorphous phase is formed on the PZT film 26a by a high frequency sputtering process with a thickness of 30 nm, for example.

Figure 3D:
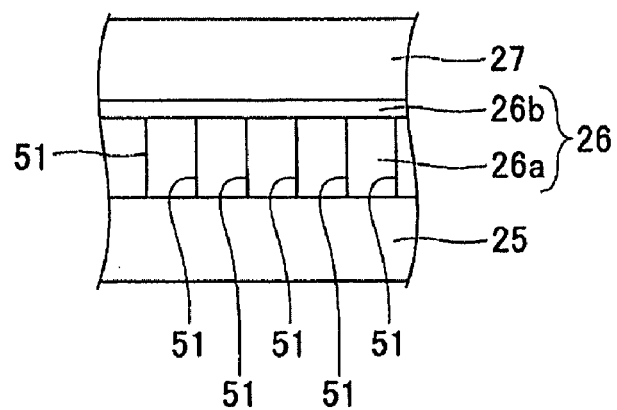

Next, as shown in FIG. 3D, an upper electrode film 27 is formed on the PZT film 26b without causing crystallization in the PZT film 26b. Thereafter, the PZT film 26b is crystallized by conducting a thermal annealing process. As a result of this, grain boundaries 52 are formed in the PZT film 26b as shown in FIG. 3E.

The PZT films 26a and 26b thus formed by sputtering process have a composition represented as $Pb(Zr_x,Ti_{1-x})O_3$ ($0 \leq x \leq 1$) wherein the PZT films are generally doped with at least one element selected from the group consisted of Ca, Sr, La, Nb, Ta, Ir and W.

Figure 3E:
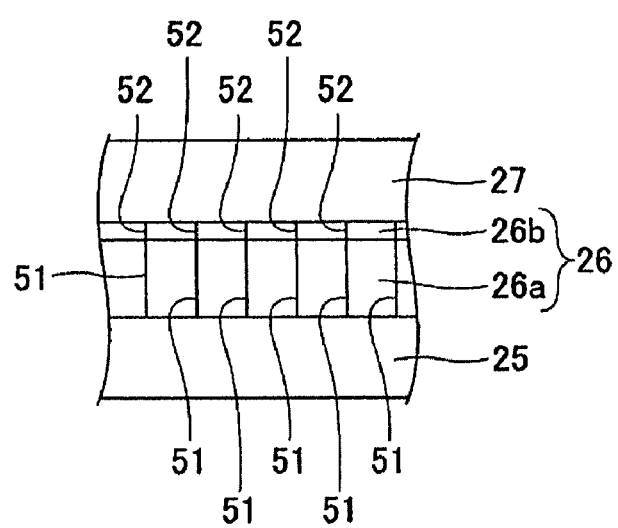

Now, as shown in FIG. 3E, the upper electrode film 27 is formed on the ferroelectric film 26 subsequently to the formation of the ferroelectric film 26. When forming the upper electrode film 27, an IrOx film of the first layer is deposited and a rapid thermal annealing process is conducted. Thereafter, an $IrO_2$ film of the second layer is deposited.

Figure 2F:
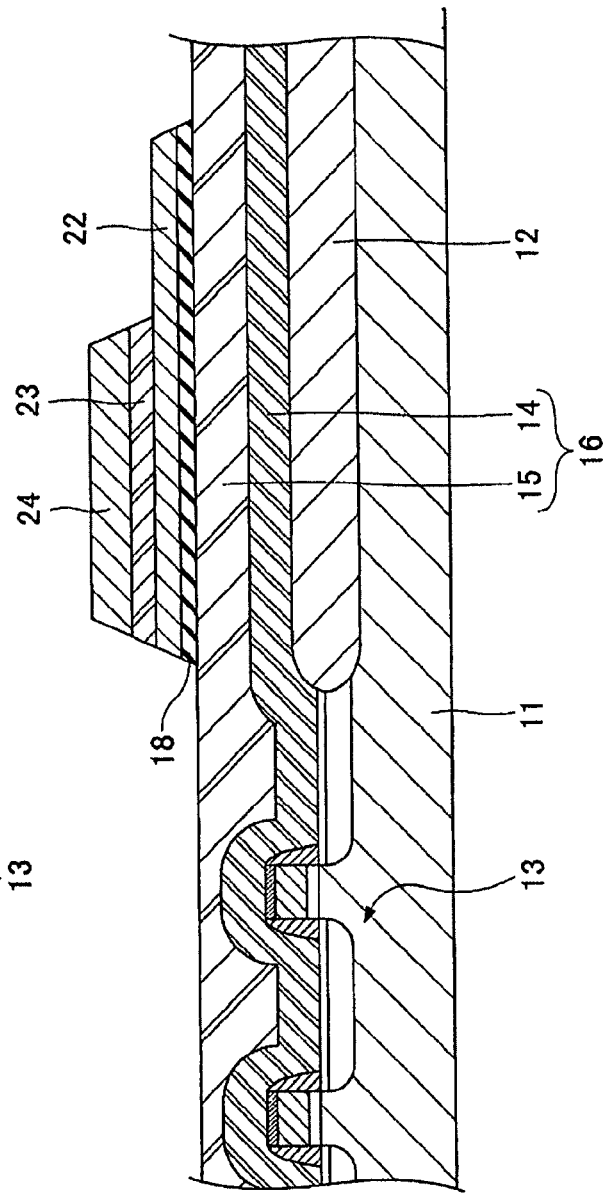

Subsequently, a resist pattern (not shown) is formed on the upper electrode film 27 with a desired pattern of the upper electrode of the ferroelectric capacitor, and etching is applied to the upper electrode film 27 while using the resist pattern as a mask. As a result, an upper electrode 24 is formed from the upper electrode film 27 as shown in FIG. 2F.

Next, the resist pattern is removed and thermal annealing process is conducted in a furnace. It should be noted that this thermal annealing process is a process for curing the damages caused in the dielectric film 26 at the time of formation of the IrOx film. As a result of such a thermal annealing process, the ferroelectric film 26 also undergoes densification.

Next, a new resist pattern (not shown) having the desired pattern of capacitor insulation film is formed, and the ferroelectric film 26 is subjected to etching while using the resist pattern as a mask. As a result, a capacitor insulation film 23 is formed from the ferroelectric film 26 as shown in FIG. 2F.

Further, the resist pattern is removed and a new resist pattern having the desired shape of the lower electrode is formed. Further, by using this resist pattern as a mask, the Pt film 25 and the $Al_2O_3$ film 18 are etched, and as a result, a lower electrode 22 is formed from the Pt film 25 as shown in FIG. 2F. With this, the ferroelectric capacitor is formed.

Figure 2G:
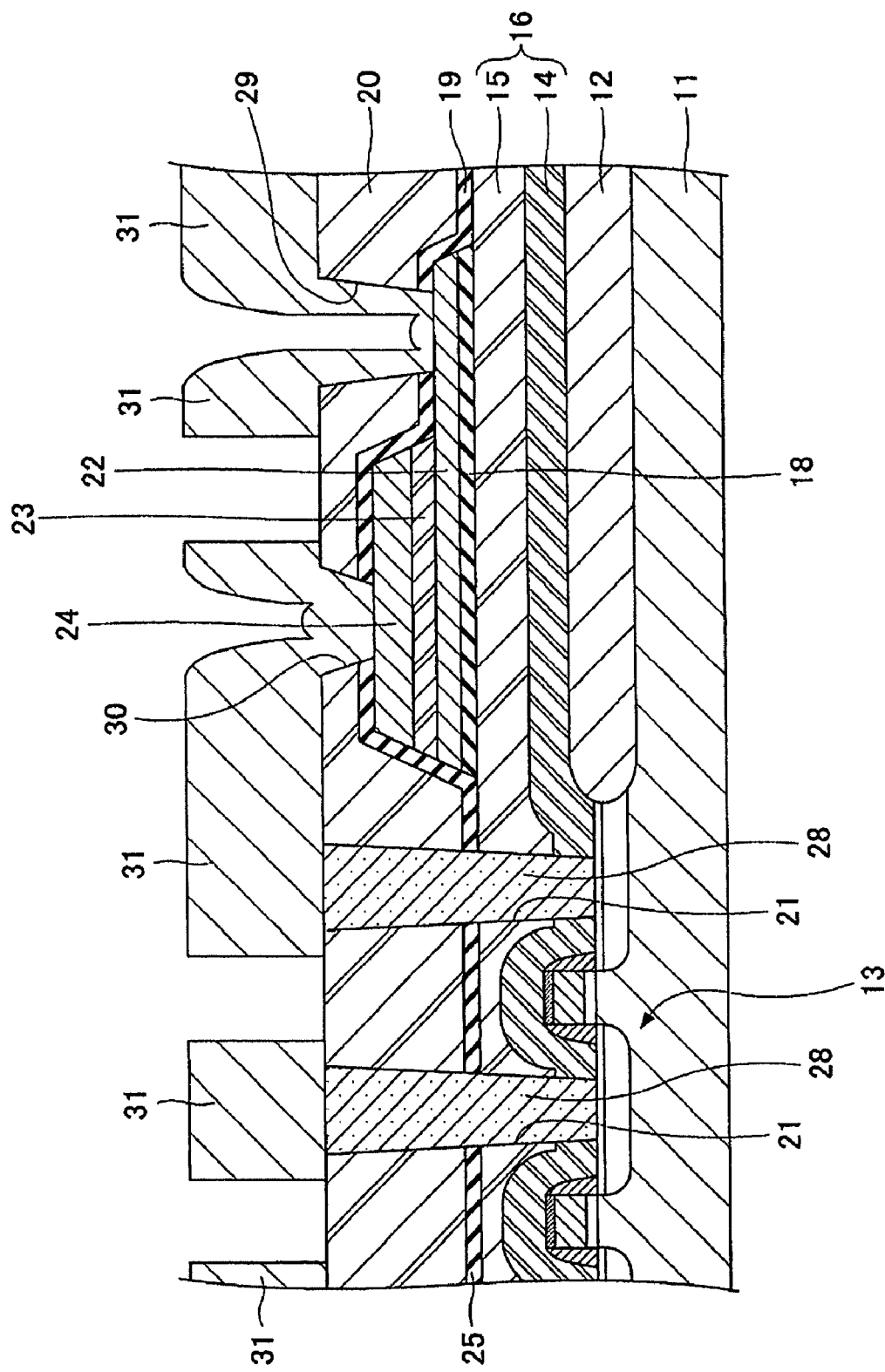

Next, as shown in FIG. 2G, an $Al_2O_3$ film is formed on the entire surface of the structure of FIG. 2F as a protective film 19 to hydrogen by a sputtering process for the purpose of protecting the capacitor insulation film 23 of PZT, which easily undergoes reduction, from hydrogen. The protective film 19 may have a thickness of 50 nm, for example.

Thereafter, an $SiO_2$ film 20 is formed on the entire surface by a CVD process as a second interlayer insulation film, wherein the $SiO_2$ film 20 may have a thickness of 1500 nm, for example. Further, a CMP process is conducted subsequently for planarization of the $SiO_2$ film 20.

Next, a contact hole 21 is formed through the $SiO_2$ film 20, the protective film 19, the $SiO_2$ film 15 and the oxidation protection film 14 by a dry etching process so as to reach a silicide layer on the source/drain diffusion layer of the CMOS transistor 13, while using a resist pattern of predetermined shape (not illustrated) as a mask.

Next, the resist pattern is removed, and the contact hole 21 is filled with a W film after forming a Ti film and a TiN film an adhesion layer. Further, by conducting a CMP to the conductive films thus formed, a conductive plug 28 formed of the adhesion layer and the W film is left in the contact hole 21.

Next, a contact hole 30 reaching the upper electrode 24 and a contact hole 29 reaching the lower electrode 22 are formed in the $SiO_2$ film 20 and the protective film 19 by a dry etching process while using another resist pattern (not shown) of predetermined shape as a mask.

Thereafter, the resist pattern is removed and an Al wiring 31 is formed on the $SiO_2$ film 20, wherein the Al wiring includes the part connecting a diffusion layer of the CMOS transistor 13 and the upper electrode 24.

Further, while not illustrated, there may be conducted further formation of interlayer insulation films and associated formation of contact plugs and wiring layers. Finally, a cover film is formed in the form of TEOS oxide film and SiN film, and with this, fabrication of the ferroelectric memory is completed.

With the present embodiment explained heretofore, it should be noted that there is formed a void along the grain boundaries 51 near the surface of the PZT film 26a at the time the grain boundaries 51 are formed in the PZT film 26a. However, such a void is filled immediately by the PZT film 26b with the present embodiment, by forming the PZT film 26b subsequent to the formation of the grain boundaries 51.

With regard to the PZT film 26b, on the other hand, crystallization thereof is achieved after formation of the upper electrode film 27. Thus, there occurs no substantial formation of void even when there is caused formation of the grain boundaries 52. Accordingly, the present invention can suppress the leakage current.

Further, with the present invention, it is possible to suppress the problem of degradation of the switching electric charge by conducting the crystallization of the PZT film 26b after formation of the upper electrode film 27. Furthermore, with the present invention, it is possible to achieve high switching electric charge in view of the fact that the ferroelectric film 26 is formed of the PZT film 26a and the PZT film 26b of the same material.

In the case a material containing Pt is used for the upper electrode film 27, there tends to occur the problems of coming-off of the upper electrode and insufficient switching electric charge as noted before. Thus, there is a need of using a material not containing Pt for the upper electrode film 27.

Further, as will be explained later, the inventor of the present invention has discovered that, by forming the ferroelectric capacitor under such a condition, not only in-plane variation of switching electric charge is suppressed but there is achieved improvement also in TDDB resistance and imprint resistance.

Further, according to the method of the present invention, it becomes possible to improve the crystal quality of the PZT film 26b by conducting the thermal annealing process for crystallizing the PZT film 26a at a temperature exceeding 585° C. This is because the degree of (111) orientation is improved for the PZT film 26a as a result of conducting the thermal annealing process for causing crystallization in the PZT film 26a at the temperature exceeding 585° C., while such improved (111) orientation facilitates epitaxial growth of the PZT film 26b that uses the crystal orientation of the PZT film 26a in the event the crystallization of the PZT film 26b is conducted after the formation of the upper electrode 27. Thus, the better the crystal quality of the PZT film 26a, the better the crystal quality of the PZT film 26b, and overall crystal quality of the PZT film 26 is improved as a result.

With this, it becomes possible to obtain a semiconductor device of desired excellent characteristics with further improved yield.

With the present invention, it should be noted that the ferroelectric memory is not limited to the 1T1C structure, but the present invention is applicable also to the ferroelectric memory of 2T2C structure.

EXAMPLE

Next, explanation will be made on the experiment conducted by the inventor of the present invention.

First, an $SiO_2$ film was formed on the surface of a silicon substrate with a thickness of 100 nm by a thermal oxidization process, and an $Al_2O_3$ film was formed on the $SiO_2$ film of 20 nm by a sputtering process that uses an $Al_2O_3$ target, with a thickness of 20 nm. The sputtering process was conducted under the condition of: power=2 kW, Ar flow rate=20 sccm; temperature=room temperature; deposition duration=34 seconds.

Next, a Pt film was formed on the $Al_2O_3$ film with a thickness of 150 nm by a sputtering process that uses a Pt target. The deposition was conducted under the condition of: Power=0.5 kW; Ar flow rate=199 sccm; temperature=350° C.; and deposition duration=180 seconds. The Pt film thus formed is used for the lower electrode film.

Figure 4:
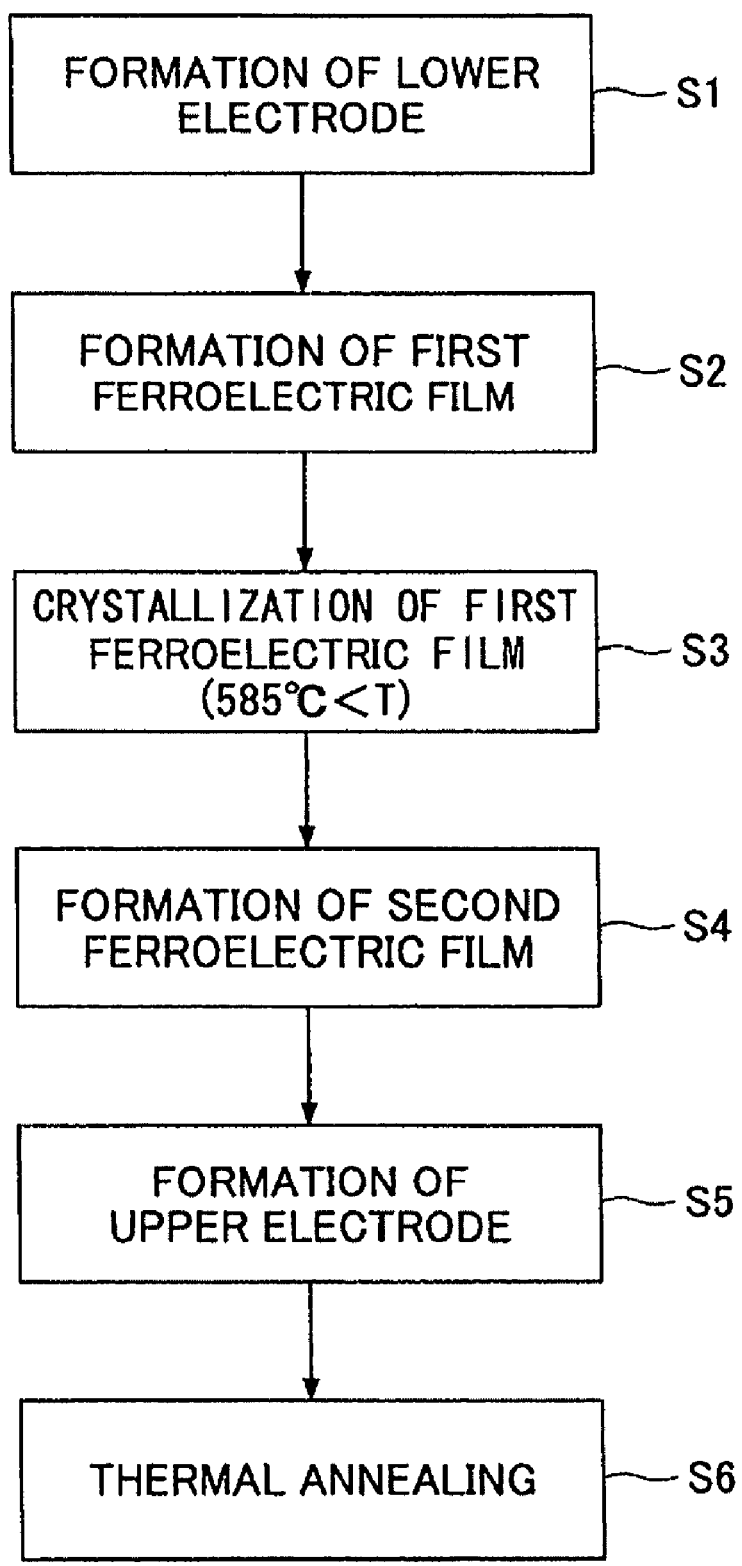
FIG. 4 is a flowchart showing formation of the ferroelectric film and the upper electrode film.

Next, formation of the ferroelectric film and the upper electrode film was conducted according to the process shown in FIG. 4.

Referring to FIG. 4, after formation of the lower electrode film as noted above (step S1), a first PZT film (the film corresponding to the PZT film 26a) was formed on the lower electrode film by a sputtering process that uses a PZT target (step S2).

More specifically, the sputtering of the PZT film was conducted under the condition of: power=1 kW; Ar gas flow rate=20 sccm; temperature=50° C.; and deposition duration=176 seconds.

As a result, the first PZT film was obtained with a thickness of 90 nm with a Pb amount of 1.13. Here, it should be noted that the Pb amount is related to the content of Pb, Zr and Ti and is defined as the amount of Pb as normalized to a total amount of Zr and Ti.

Next, the first PZT film thus formed was subjected to crystallization process by using a rapid thermal annealing (RTA) apparatus (step S3). More specifically, the thermal annealing process was conducted under the condition of: temperature=600° C.; Ar flow rate: 1.975 slm; $O_2$ flow rate=25 sccm; and heating duration=90 seconds).

Further, for the purpose of comparison, two comparative examples were prepared by setting the thermal annealing temperature of the step S3 to 560° C. and 585° C., respectively.

Next, a second PZT film (corresponding to the PZT film 26b) was formed on the first PZT film by a sputtering process that uses a PZT target (step S4). Formation of the second PZT film was conducted under the condition of: power=1 kW; Ar flow rate=20 sccm; temperature=50° C.; deposition duration=59 seconds. The second PZT film thus formed had a thickness of 30 nm and was characterized by a Pb amount of 1.13.

Next, an $IrO_2$ film was formed on the second PZT film as the upper electrode film by a sputtering process that uses an Ir target (step S5). In the experiment, the $IrO_2$ film was formed under the condition of: power=2 kW; Ar flow rate=100 sccm; $O_2$ flow rate=57 sccm; temperature=20° C.; deposition duration=9 seconds). The $IrO_2$ film thus formed had a thickness of 50 nm.

Further, the second PZT film was crystallized by conducting a thermal annealing process while using the RTA apparatus (step S6). The thermal annealing process was conducted under the condition of: temperature=725° C.; Ar flow rate=1.98 slm; $O_2$ flow rate=20 sccm; and heating duration=120 seconds.

After forming such ferroelectric capacitors, switching electric charge, leakage current, TDDB lifetime resistance; and imprint resistance were measured for these ferroelectric capacitors.

Figure 5:
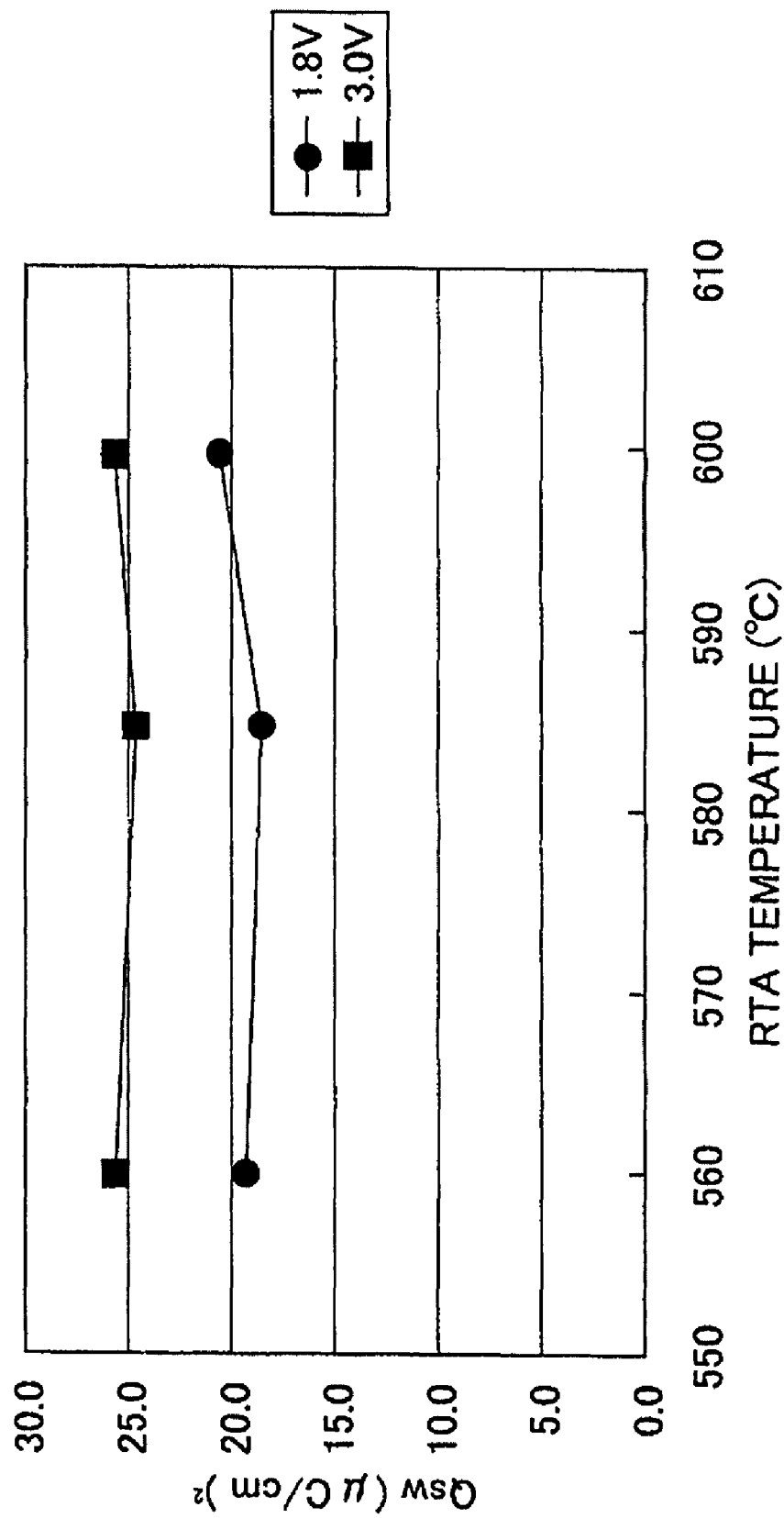
FIG. 5 is a diagram showing the relationship between crystallization temperature and polarization of the ferroelectric film.

FIG. 5 compares the switching electric charge of these ferroelectric capacitors for various annealing temperatures, wherein it should be noted that the measurement of the switching electric charge was made at room temperature for a cell array capacitor in which 1024 capacitors each having a size of 1.15 μm×2.10 μm are integrated. In the drawings, both of the switching electric charge for the case of applying a 1.8V voltage and the switching electric charge for the case of applying a 3.0V voltage are represented.

Referring to FIG. 5, no substantial difference of switching electric charge is noted with regard to the thermal annealing temperature of the first PZT film 26 for any of the applied voltages. This means that there is caused no influence on the switching electric charge even when the temperature of the thermal annealing process applied to the PZT film 26a in the step S3 of FIG. 4 is increased as in the present embodiment. Thus, it becomes possible to maintain large switching electric charge even when a high annealing temperature is used in the step S3 of FIG. 4.

Figure 6:
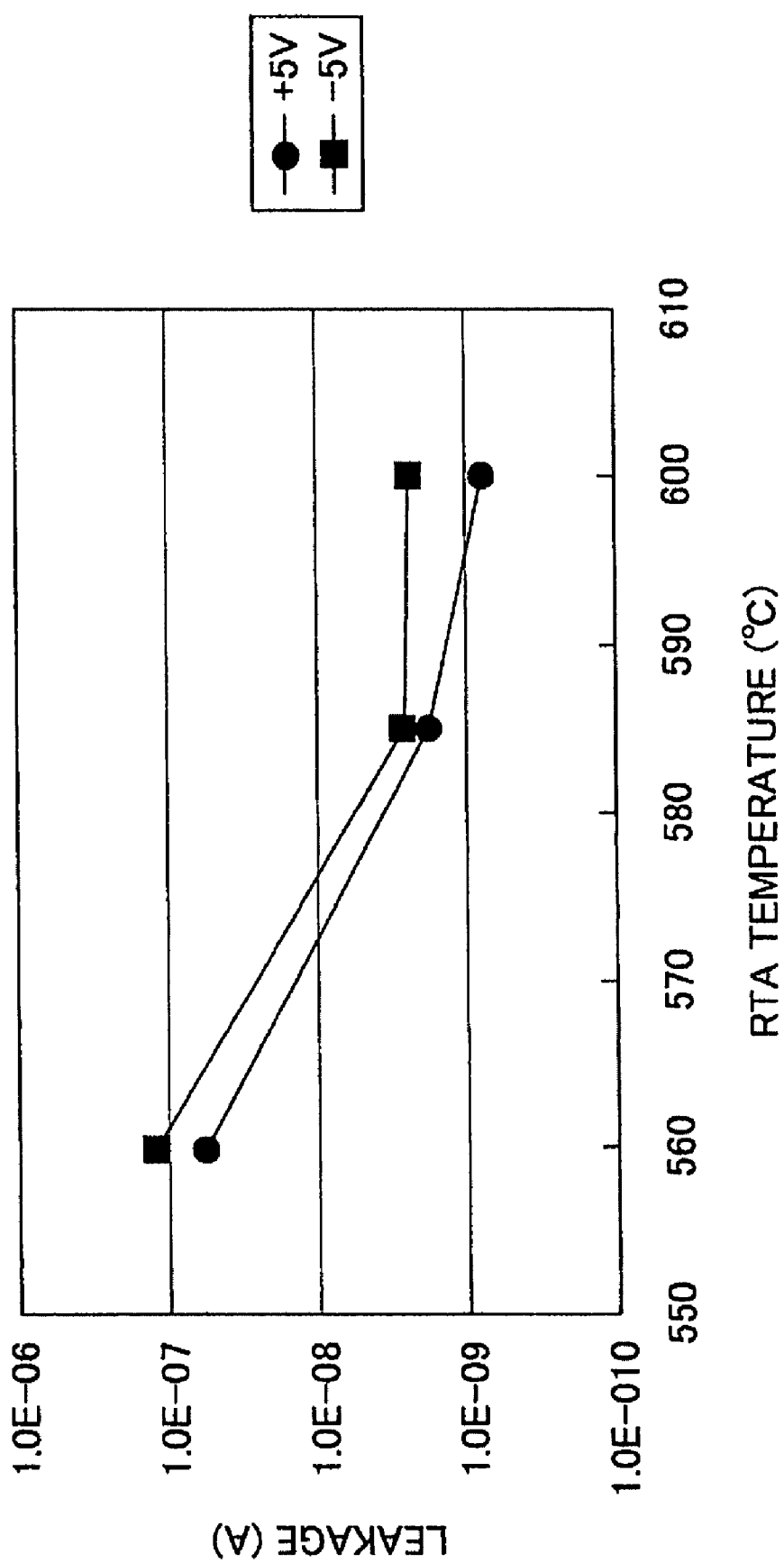
FIG. 6 is a diagram showing the relationship between crystallization temperature and leakage current of the ferroelectric film.

FIG. 6 compares the leakage current of the ferroelectric capacitor for various annealing temperatures, wherein it should be noted that the measurement of the leakage current was made at room temperature for a cell array capacitor in which 1024 capacitors each having a size of 1.15 μm×2.10 μm are integrated. In the drawings, both of the leakage current for the case of applying a +5.0V voltage and the leakage current for the case of applying a −5.0V voltage are represented.

Referring to FIG. 6, it can be seen that the leakage current shows the tendency to increase the annealing temperature when the annealing temperature in the step S3 is lower than 585° C. At the thermal annealing temperature of 585° C. or higher, on the other hand, it can be seen that the leakage current takes a generally constant value. This means that there is caused little influence on the leakage current even when the temperature of the thermal annealing temperature of the step S3 applied to the PZT film 26a is increased as in the present embodiment, and that it is possible to maintain low leakage current.

Figure 7:
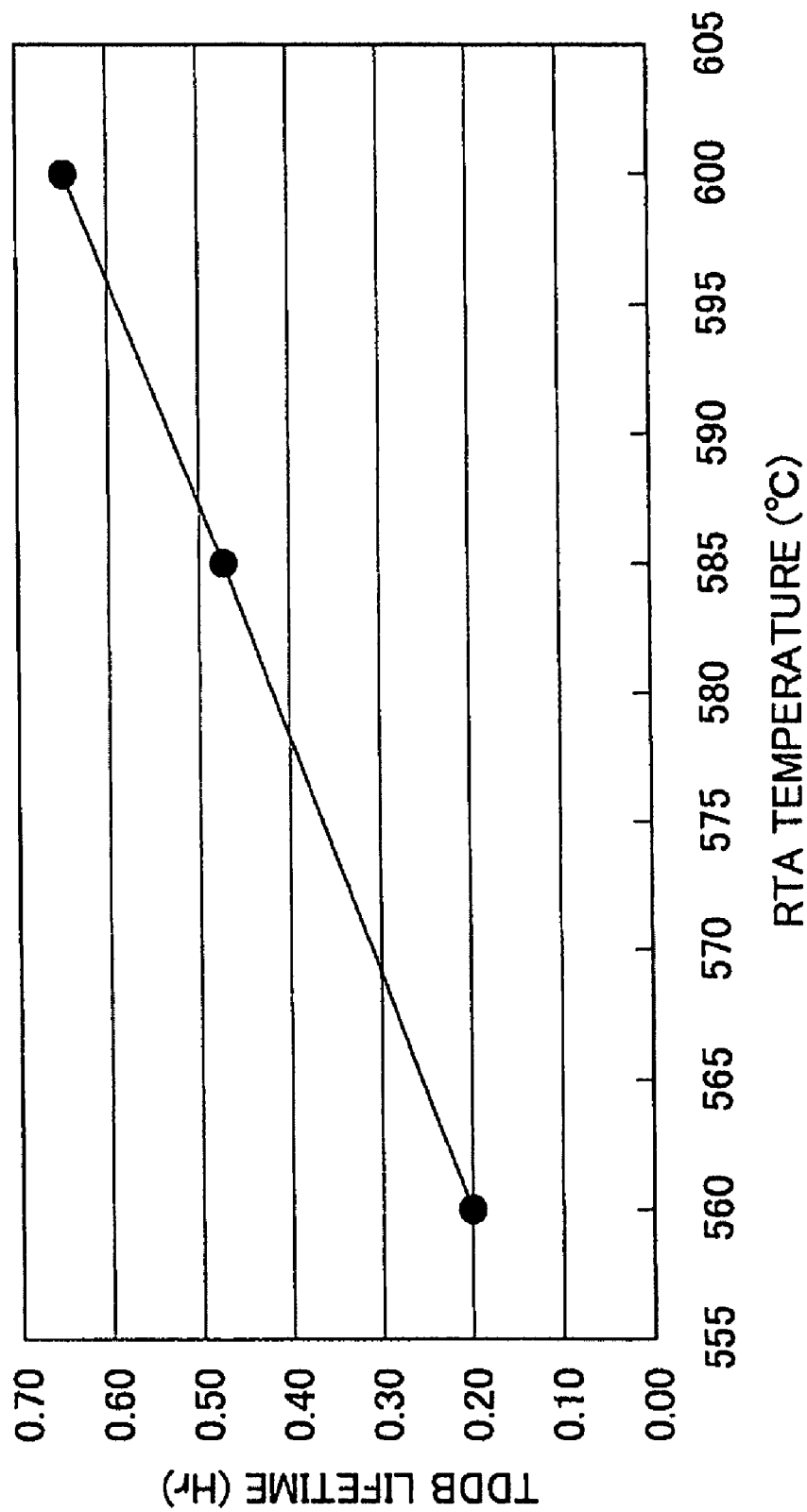
FIG. 7 is a diagram showing the relationship between crystallization temperature and TDDB lifetime of the ferroelectric film.

FIG. 7 shows a TDDB lifetime of the ferroelectric capacitor, wherein the TDDB lifetime was measured at 125° C. while using a capacitor of 50 μm×50 μm size. Measurement of the TDDB lifetime is made at 125° C. while using a capacitor of 50 μm×50 μm. In more detail, a voltage of 10.8V is applied to the ferroelectric capacitor and the TDDB lifetime is determined as the time until the ferroelectric capacitor undergoes insulation breakdown.

Referring to FIG. 7, it can be seen that the TDDB lifetime increases with increasing thermal annealing temperature used in the step S3 of FIG. 4. Thus, it was discovered by the inventor of the present invention that TDDB resistance can be increased by setting the thermal annealing temperature of the PZT film 26a to be higher than the thermal annealing temperature of the comparative examples.

Figure 8:
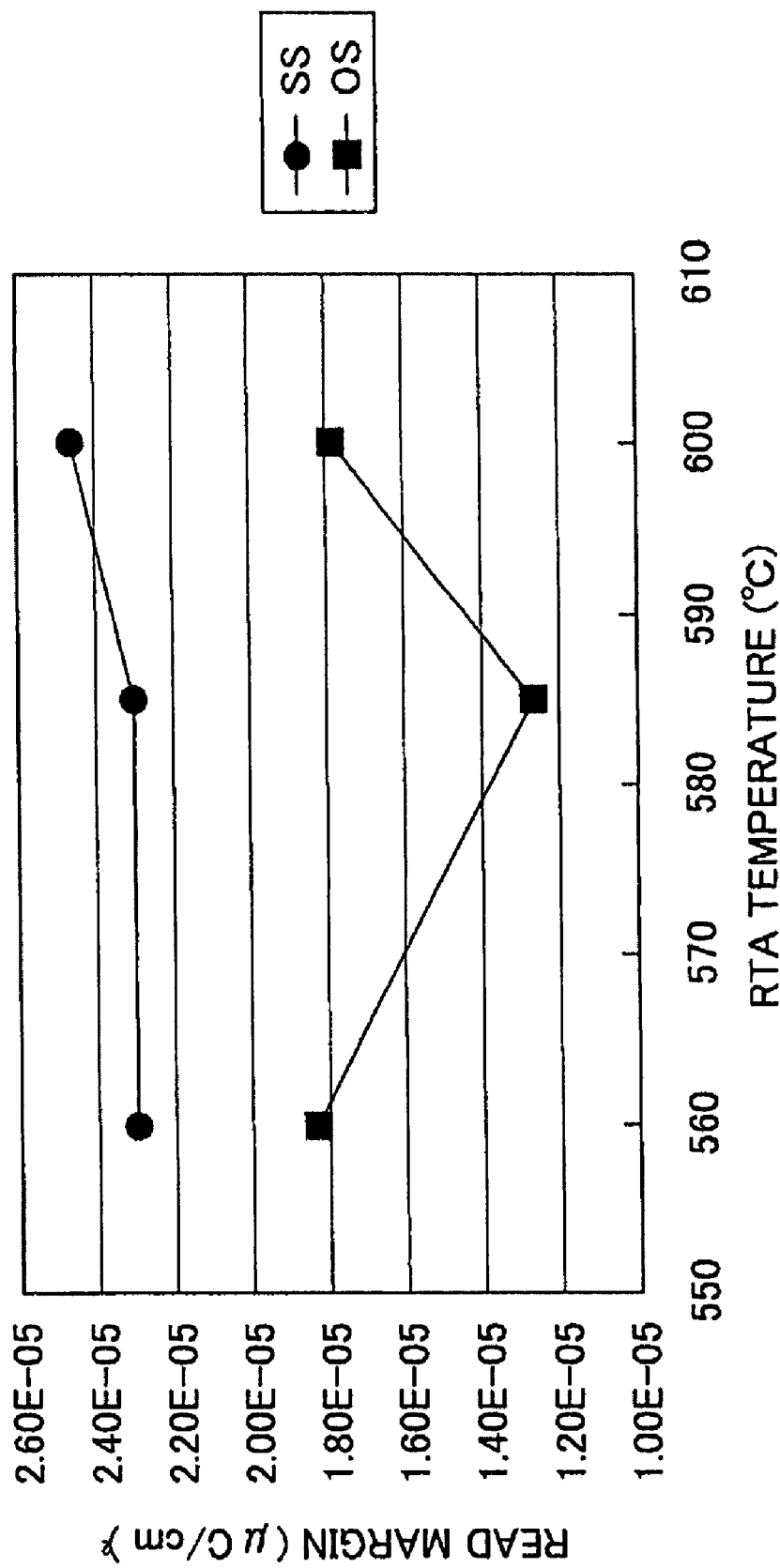
FIG. 8 is a diagram showing the relationship between crystallization temperature of the ferroelectric film and reading margin.

FIG. 8 shows a reading margin of the ferroelectric capacitor, wherein the measurement of FIG. 8 is conducted by using a cell array capacitor integrating therein 1024 capacitors, each having a size of 1.15 µm×2.10 µm. The measurement is conducted for ferroelectric capacitor pairs each including a capacitor A and a capacitor B.

Figure 9:
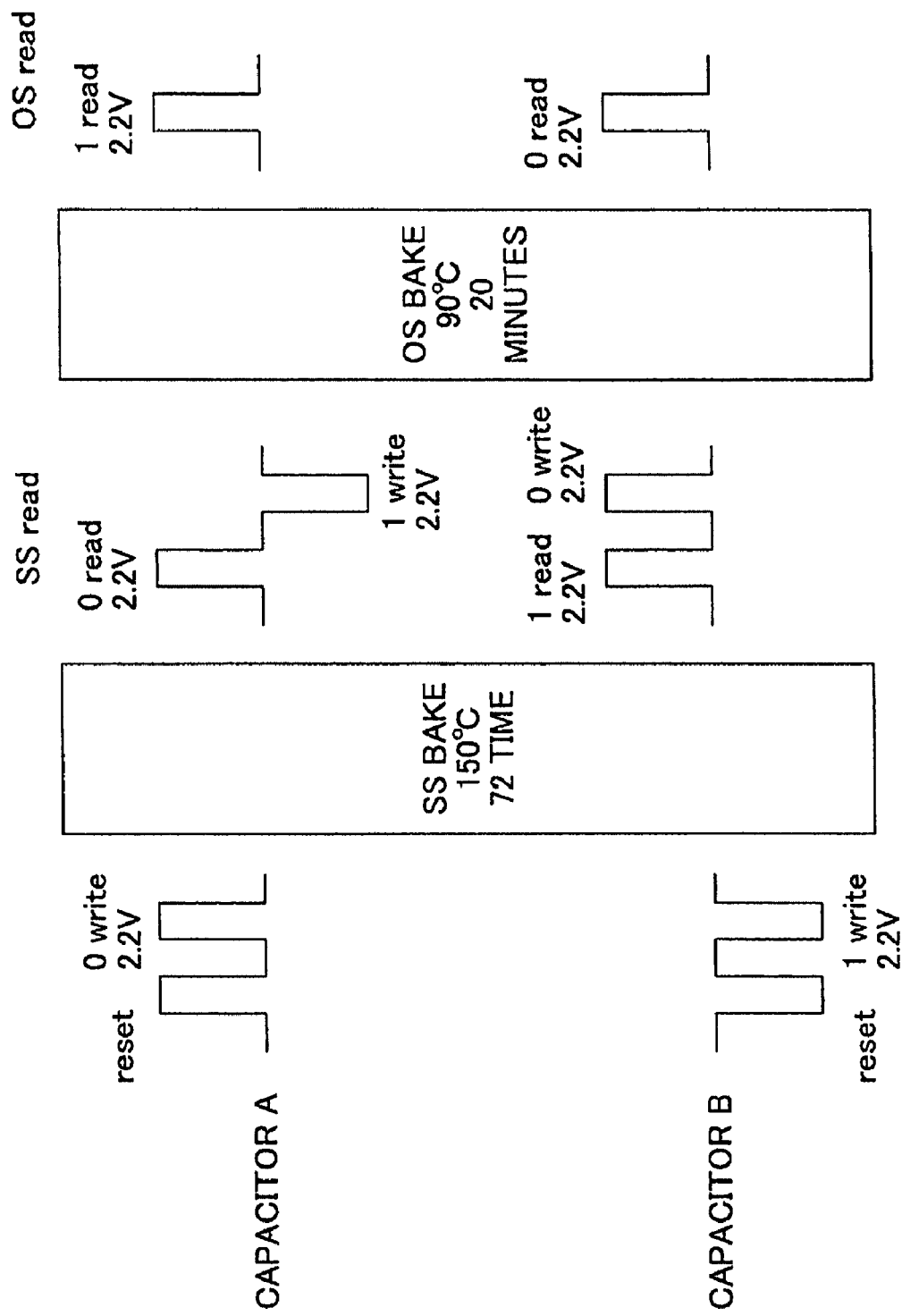
FIG. 9 is a diagram explaining the measuring method of FIG. 8.

FIG. 9 shows the read margin measurement method of FIG. 8.

Referring to FIG. 9, information "0" is written into a capacitor A and information "1" is written into the capacitor B at fires while using a writing voltage of 2.2V.

Subsequently, baking is conducted at 150° C. for 72 hours, and reading is conducted after cooling to room temperature at a voltage of 2.2V. This reading is called "SS read". Further, difference between the switching electric charge of the capacitor A and the switching electric charge of the capacitor B in such a SS read mode is obtained and is plotted in FIG. 8 as read margin of SS mode.

Next, after the foregoing SS read, information "1" is written into the capacitor A and information "0" is written into the capacitor B. Further, baking is conducted at 90° C. for 20 minutes, and reading is conducted after cooling to room temperature at a voltage of 2.2V. This reading is called "OS read". Further, difference between the switching electric charge of the capacitor A and the switching electric charge of the capacitor B in such an OS read mode is obtained and is plotted in FIG. 8 as the read margin of OS mode.

Referring to FIG. 8, it can be seen that the read margin of SS mode is substantially the same for the case when the thermal annealing temperature of the step S3 of FIG. 4 is set to 560° C. and for the case when the thermal annealing temperature of the step S3 is set to 585° C., while when the thermal annealing temperature of the step S3 is set to 600° C., it can be seen that the read margin of SS mode increases slightly.

With regard to the OS read mode, it can be seen that the read margin shows the tendency to decrease when the thermal anneal temperature of the step S3 of FIG. 4 is increased from 560° C. to 585° C.

Thus, the foregoing tendency provides a prediction that the read margin of the OS mode would decrease further when the thermal annealing temperature of the step S3 of FIG. 4 is increased beyond 585° C.

Contrary to the foregoing prediction, it was discovered that the read margin of OS mode increases sharply when the thermal annealing temperature is increased beyond 585° C. and reached 600° C.

Thus, the present invention proposes to expand the read margin of SS mode and the read margin of OS mode by conducting the thermal annealing process of the step S3 of FIG. 4 at the temperature exceeding 585° C. and to improve the imprint characteristics at the same time to the leakage current characteristics and TDDB lifetime.

Here, it should be noted that, in the case the upper electrode is formed immediately after the step S3 of FIG. 4 and the thermal annealing process applied thereto, there arises the problem of increased leakage current. Further, when the formation of the upper electrode is conducted after the step S4 of FIG. 4 and after the crystallization of the second ferroelectric film, there arises the problem of decreased switching electric charge.

It is preferable that the thermal annealing temperature used for the step S3 of FIG. 4 does not exceed the thermal annealing temperature of the step S6 used for crystallization.

Figure 10:
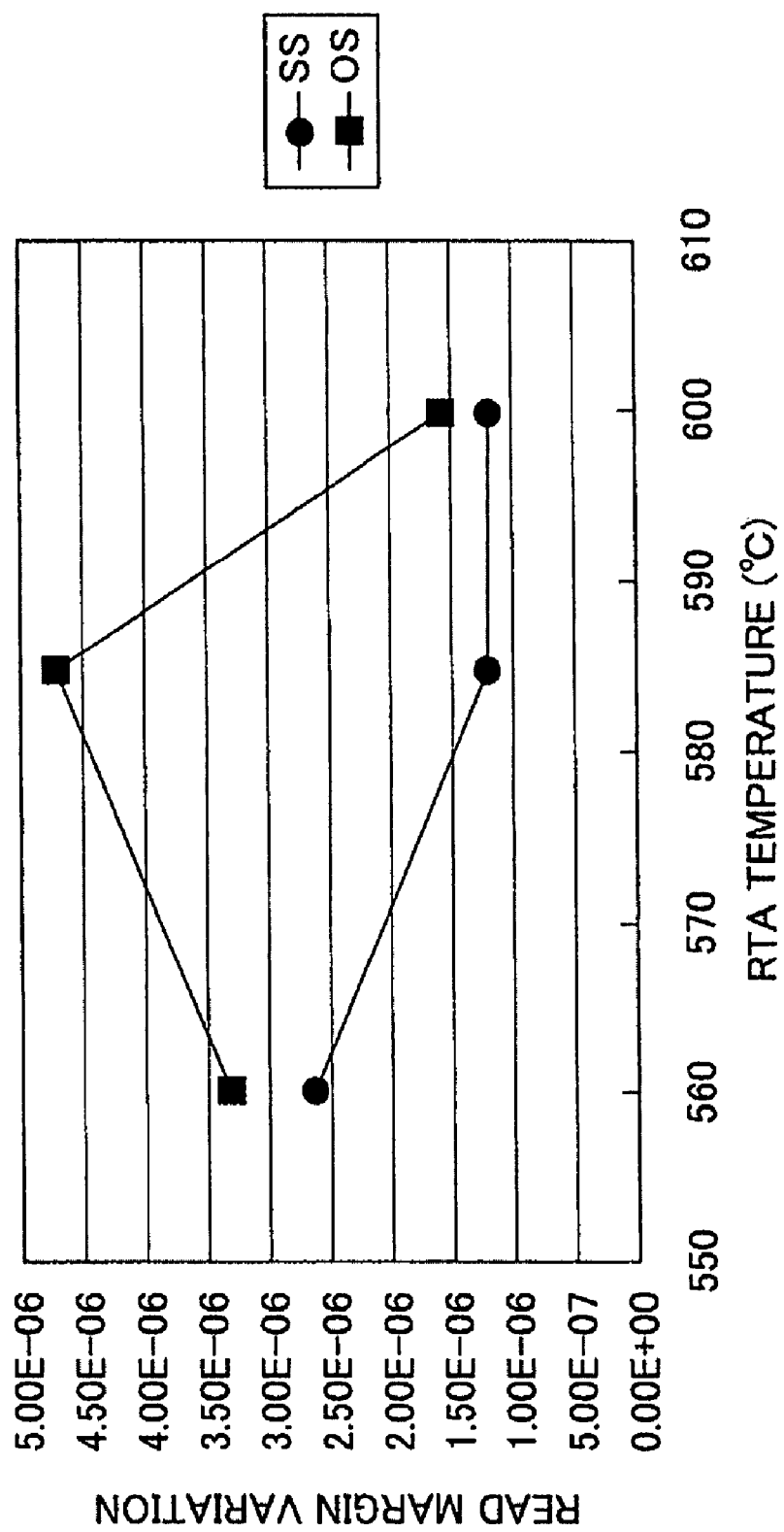
FIG. 10 is a diagram showing the relationship between crystallization temperature and reading margin fluctuation for the ferroelectric film.

FIG. 10 shows the variation of read margin or read margin variation of the SS mode and also the read margin variation of the OS mode shown in FIG. 8. In FIG. 10, it should be noted that the indicated variation includes those between different wafers and those within a single wafer.

Referring to FIG. 10, it can be seen that the read margin variation for the SS mode tends to increase with decrease of the thermal annealing temperature when the thermal annealing temperature of the step S3 is lower than 585° C., while it can also be seen that the read margin variation for the SS mode takes a small value when the thermal annealing temperature is equal to or higher than 585° C.

With regard to the read margin for the OS read mode, on the other hand, the variation takes a larger value when the thermal annealing temperature of the step S3 is 585° C. as compared with the case where the thermal annealing temperature is 560° C. Thus, it is observed that the read margin variation tends to increase with increase of the thermal annealing temperature of the step S3, provided that the thermal annealing temperature is equal to or lower than 585° C.

Thus, it is predicted that the read margin variation would increase for the OS read mode further when the thermal annealing temperature is increased beyond 585° C.

Contrary to the foregoing prediction, it was discovered with the present invention that the read margin variation for the OS mode decreases when the thermal anneal temperature is increased beyond 585° C.

Thus, according to the present invention, it is possible to improve the imprint characteristics of the ferroelectric capacitor by conducting the thermal annealing process of the step S3 of FIG. 4 at the temperature exceeding 585° C.

Second Embodiment

Figure 11:
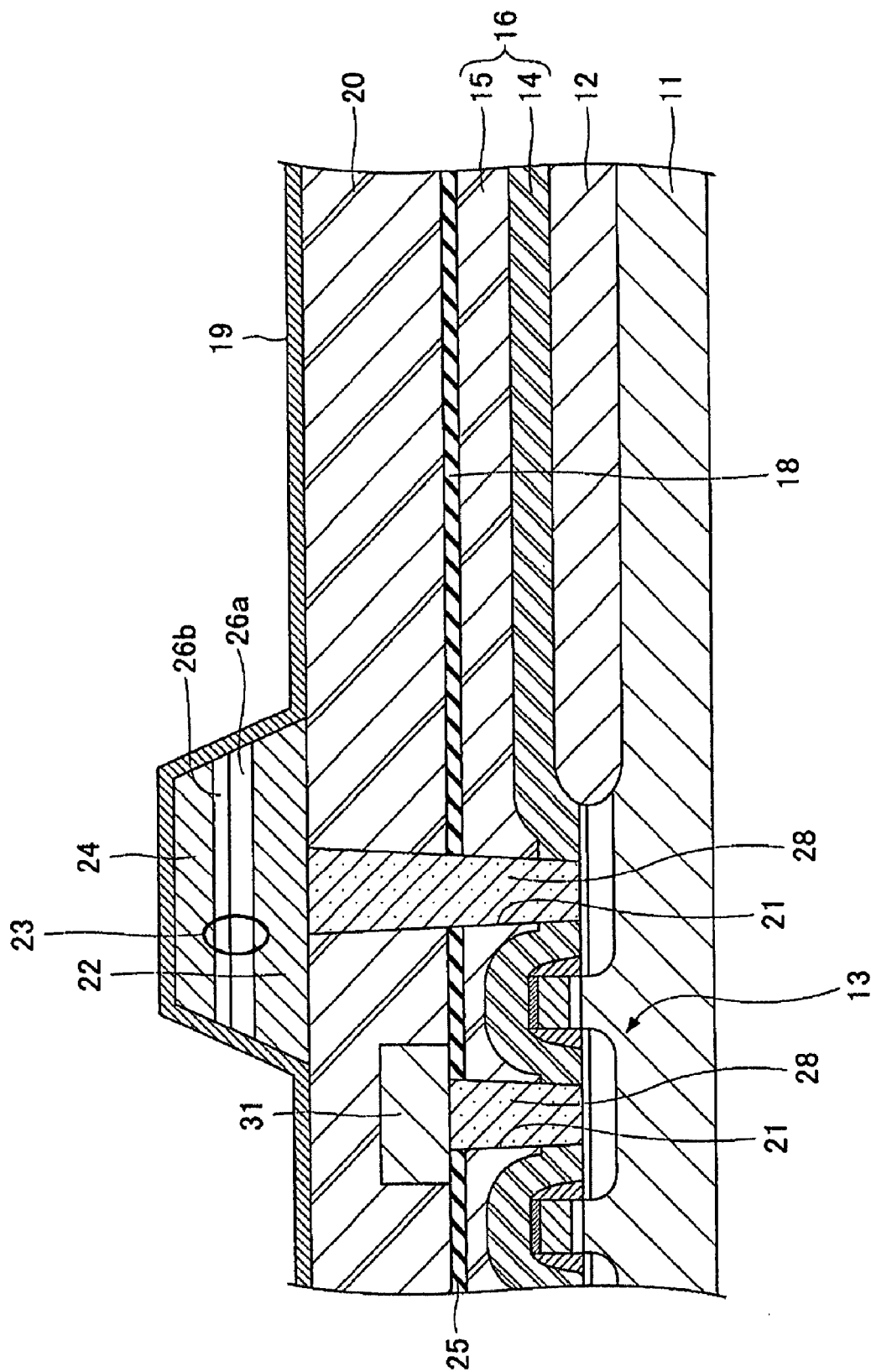
FIG. 11 is a diagram showing the construction of a ferroelectric memory according to a second embodiment of the present invention.

FIG. 11 shows the construction of a ferroelectric memory according to a second embodiment of the present invention, wherein those parts corresponding to the parts explained previously are designated by the same reference numerals and the description thereof will be omitted.

Referring to FIG. 11, the ferroelectric memory according to the present embodiment includes a ferroelectric capacitor of the construction in which the lower electrode 22, the capacitor insulation film 23 and the upper electrode 24 are laminated, wherein the ferroelectric capacitor is formed with the present embodiment on the interlayer insulation film 20 such that the ferroelectric capacitor is located on a conductive plug 18. Thereby, the conductive plug 18 makes a contact to a bottom surface of the lower electrode 22. Further, the ferroelectric capacitor has a sidewall surface and a top surface thereof covered by the hydrogen barrier film 19 of $Al_2O_3$. Further, another interlayer insulation film not illustrated is formed on the hydrogen barrier film 19.

In this another interlayer insulation film, there is formed a via-hole exposing the upper electrode 24 via the hydrogen barrier film 19, and the upper electrode 24 is connected to an interconnection pattern formed on the foregoing another interlayer insulation through a via-hole.

Further, with the construction of FIG. 11, there is formed an interconnection pattern 31 forming a bit-line pattern on the protective film 18.

With the construction of FIG. 11, too, the ferroelectric capacitor insulation film 23 is formed of the first PZT film 26a and the second PZT film 26b thereon, and the first PZT film 26a is formed on the lower electrode layer in step S2 of FIG. 4 as explained previously.

The first PZT film 26a is crystallized in the step S3 by conducting a thermal annealing process in the ambient containing oxygen at a temperature exceeding 585° C.

On the other hand, the second PZT film 26b is formed in the step S4 of FIG. 4 in amorphous state and is crystallized by the thermal annealing process of the step S6 after formation of the upper electrode layer in the step S5.

With the construction of FIG. 11, too, there occurs a decrease of leakage current without deteriorating the switching electric charge, similarly to the previous embodiment, and preferable features such as improved TDDB lifetime and improved imprint characteristics are attained.

While the present invention has been explained for preferred embodiments, the present invention is by no means limited to the embodiments described heretofore, but various variations and modifications may be made without departing from the scope of the invention.

What is claimed is:

1. A method for fabricating a semiconductor device, comprising:
    forming a first ferroelectric film over a lower electrode;
    crystallizing said first ferroelectric film by a thermal annealing process at a temperature of 600° C. or higher;
    forming a second ferroelectric film in an amorphous state over said first ferroelectric film so as to fill voids existing on a surface of said first ferroelectric film; and
    forming an upper electrode over said second ferroelectric film of said amorphous state.

2. The method as claimed in claim 1, wherein said crystallizing step of said first ferroelectric film is conducted in ambient containing oxygen.

3. The method as claimed in claim 2, wherein said ambient contains an oxygen gas with a concentration of about 1.25%.

4. The method as claimed in claim 1, further comprising, after said step of forming said upper electrode, a step of annealing said first and second ferroelectric films in an ambient containing oxygen at a temperature higher than said temperature used in said crystallizing step of said first ferroelectric film.

5. The method as claimed in claim 1, wherein said first and second ferroelectric films are formed by a sputtering process.

6. The method as claimed in claim 1, wherein said first and second ferroelectric films comprises a PZT film doped with at least one element selected from the group consisting of Ca, Sr, La, Nb, Ta, Ir and W.

7. The method as claimed in claim 1, wherein said upper electrode is free from Pt.

8. The method as claimed in claim 1, wherein said step of forming said first ferroelectric film forms said first ferroelectric film in an amorphous state.

9. The method as claimed in claim 1, wherein said step of forming said upper electrode is carried out at a temperature lower than a temperature at which said second ferroelectric film undergoes crystallization.

10. The method as claimed in claim 9, wherein said step of forming said upper electrode is carried out at a room temperature.

11. The method as claimed in claim 4, wherein said step of annealing is carried out at a temperature of 725° C. or higher.

12. The method as claimed in claim 4, further comprising the step, after said step of annealing, of forming another upper electrode on said upper electrode.

13. The method as claimed in claim 12, wherein said upper electrode comprises IrOx and wherein said another upper electrode comprises $IrO_2$.

14. The method as claimed in claim 1, wherein said first ferroelectric film has a film thickness larger than a film thickness of said second ferroelectric film.

15. The method as claimed in claim 1, further comprising the step of forming a protective film covering said lower electrode, said first ferroelectric film, said second ferroelectric film and said upper electrode.

16. The method as claimed in claim 1, wherein said first ferroelectric film and said second ferroelectric film contain Pb, Zr and Ti therein.

* * * * *